(12) United States Patent
Costa et al.

(10) Patent No.: US 9,892,987 B2
(45) Date of Patent: Feb. 13, 2018

(54) THERMALLY ENHANCED SEMICONDUCTOR PACKAGE WITH THERMAL ADDITIVE AND PROCESS FOR MAKING THE SAME

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US); Merrill Albert Hatcher, Jr., Greensboro, NC (US); Stephen Mobley, Winston-Salem, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/353,346

(22) Filed: Nov. 16, 2016

(65) Prior Publication Data
US 2017/0358511 A1    Dec. 14, 2017

Related U.S. Application Data

(60) Provisional application No. 62/348,210, filed on Jun. 10, 2016.

(51) Int. Cl.
*H01L 23/48* (2006.01)
*H01L 23/52* (2006.01)
(Continued)

(52) U.S. Cl.
CPC .......... *H01L 23/3135* (2013.01); *H01L 21/56* (2013.01); *H01L 23/295* (2013.01); *H01L 23/3121* (2013.01); *H01L 23/3737* (2013.01)

(58) Field of Classification Search
CPC ............... H01L 23/3135; H01L 23/295; H01L 23/3737; H01L 23/3121; H01L 21/56
(Continued)

(56) References Cited

U.S. PATENT DOCUMENTS 4,093,562 A    6/1978  Kishimoto
4,366,202 A   12/1982  Borovsky
(Continued)

FOREIGN PATENT DOCUMENTS

CN    103811474 A    5/2014
EP    2996143 A1     3/2016
(Continued)

OTHER PUBLICATIONS

Applicant-Initiated Interview Summary for U.S. Appl. No. 13/852,648, dated Jan. 27, 2014, 4 pages.
(Continued)

*Primary Examiner* — Marc Armand
*Assistant Examiner* — Wilner Jean Baptiste
(74) *Attorney, Agent, or Firm* — Withrow & Terranova, P.L.L.C.

(57) ABSTRACT

The present disclosure relates to a thermally enhanced semiconductor package, which includes a module substrate, a thinned flip chip die over the substrate, a first mold compound component, and a thermally enhanced mold compound component. The first mold compound component resides over the module substrate, surrounds the thinned flip chip die, and extends above an upper surface of the thinned flip chip die to form a cavity over the upper surface of the thinned flip chip die. The thermally enhanced mold compound component includes a lower portion filling a lower region of the cavity and residing over the upper surface of the thinned flip chip die, and an upper portion filling an upper region of the cavity and residing over the lower portion. A first average thermal conductivity of the lower portion is at least 1.2 times greater than a second average thermal conductivity of the upper portion.

18 Claims, 9 Drawing Sheets

(51) Int. Cl.
  *H01L 29/40* (2006.01)
  *H01L 23/31* (2006.01)
  *H01L 23/29* (2006.01)
  *H01L 21/56* (2006.01)
  *H01L 23/373* (2006.01)

(58) Field of Classification Search
  USPC ........................................................ 257/774
  See application file for complete search history.

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,864,156 B1 | 3/2005 | Conn |
| 6,943,429 B1 | 9/2005 | Glenn et al. |
| 6,992,400 B2 | 1/2006 | Tlkka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 * | 2/2015 | Lenniger ............... H01L 23/367 257/691 |
| 9,165,793 B1 | 10/2015 | Wang et al. |
| 9,368,429 B2 | 6/2016 | Ma et al. |
| 9,461,001 B1 | 10/2016 | Tsai et al. |
| 2001/0004131 A1 | 6/2001 | Masayuki et al. |
| 2002/0185675 A1 | 12/2002 | Furukawa |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi |
| 2007/0075317 A1 | 4/2007 | Kato et al. |
| 2007/0121326 A1 | 5/2007 | Nall et al. |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakitirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 * | 9/2014 | Lin ....................... H01L 21/563 257/690 |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 * | 5/2015 | Tseng ..................... H01L 23/36 257/712 |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |

(56) References Cited

U.S. PATENT DOCUMENTS

| | | |
|---|---|---|
| 2016/0079137 A1 | 3/2016 | Leipold et al. |
| 2016/0093580 A1 | 3/2016 | Scanlan et al. |
| 2016/0155706 A1 | 6/2016 | Yoneyama et al. |
| 2016/0284568 A1* | 9/2016 | Morris ............... H01L 25/0655 |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Advisory Action for U.S. Appl. No. 14/715,830, dated Oct. 31, 2016, 6 pages.
Non-Final Office Action for U.S. Appl. No. 15/173,037, dated Jan. 10, 2017, 8 page.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,243, dated Aug. 31, 2016, 8 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 15/085,185, dated Feb. 15, 2017, 10 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author 2007, Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

(56) References Cited

OTHER PUBLICATIONS

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Heat Transfer," Cool Polymers, Inc., 2006, http://www.coolpolymers.com/heattrans.html, 2 pages.

Author Unknown, "Plastics that Conduct Heat," Plastics Technology Online, Jun. 2001, Retrieved Jun. 24, 2013, http://www.ptonline.com/articles/plastics-that-conduct-heat, 4 pages.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.

Costa, J., "RFCMOS SOI Technology for 4G Reconfigurable RF Solutions," Session WEC1-2, Proceedings of the 2013 IEEE International Microwave Symposium, 4 pages.

Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.

Finne, R. M. et al., "A Water-Amine-Complexing Agent System for Etching Silicon," Journal of the Electrochemical Society, vol. 114, No. 9, Sep. 1967, pp. 965-970.

Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Joshi, V. et al., "MEMS Solutions in RF Applications," 2013 IEEE SOI-3D-Subthreshold Microelectronics Technology Unified Conference (S3S), Oct. 2013, IEEE, 2 pages.

Jung, Boo Yang, et al., "Study of FCMBGA with Low CTE Core Substrate," 2009 Electronic Components and Technology Conference, May 2009, pp. 301-304.

Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.

Lederer, Dimitri et al., "Substrate loss mechanisms for microstrip and CPW transmission lines on lossy silicon wafers," Solid-State Electronics, vol. 47, No. 11, Nov. 2003, pp. 1927-1936.

Lee, Kwang Hong et al., "Integration of III-V materials and Si-CMOS through double layer transfer process," Japanese Journal of Applied Physics, vol. 54, Jan. 2015, pp. 030209-1 to 030209-5.

Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.

Mamunya, Ye.P., et al., "Electrical and Thermal Conductivity of Polymers Filled with Metal Powders," European Polymer Journal, vol. 38, 2002, pp. 1887-1897.

Mansour, Raafat R., "RF MEMS-CMOS Device Integration," IEEE Microwave Magazine, vol. 14, No. 1, Jan. 2013, pp. 39-56.

Mazuré C. et al "Advanced SOI Substrate Manufacturing," 2004 IEEE International Conference on Integrated Circuit Design and Technology, 2004, IEEE, pp. 105-111.

Morris, Art, "Monolithic Integration of RF-MEMS within CMOS," 2015 International Symposium on VLSI Technology, Systems and Application (VLSI-TSA), Apr. 27-29, 2015, IEEE, 2 pages.

Niklaus, F., et al., "Adhesive Wafer Bonding," Journal of Applied Physics, vol. 99, No. 3, 031101 (2006), 28 pages.

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

Raskin, Jean-Pierre et al., "Substrate Crosstalk Reduction Using SOI Technology," IEEE Transactions on Electron Devices, vol. 44, No. 12, Dec. 1997, pp. 2252-2261.

Raskin, J.P., et al., "Coupling Effects in High-Resistivity SIMOX Substrates for VHF and Microwave Applications," Proceedings of 1995 IEEE International SOI Conference, Oct. 1995, pp. 62-63.

Rong, B., et al., "Surface-Passivated High-Resistivity Silicon Substrates for RFICs," IEEE Electron Device Letters, vol. 25, No. 4, Apr. 2004, pp. 176-178.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.

Final Office Action for U.S. Appl. No. 13/852,648, dated Nov. 26, 2013, 21 pages.

U.S. Appl. No. 14/261,029, filed Apr. 24, 2014; now U.S. Pat. No. 9,214,337.

U.S. Appl. No. 14/529,870, filed Oct. 31, 2014.

U.S. Appl. No. 15/293,947, filed Oct. 14, 2016.

U.S. Appl. No. 14/715,830, filed May 19, 2015.

U.S. Appl. No. 14/851,652, filed Sep. 11, 2015.

U.S. Appl. No. 14/872,910, filed Oct. 1, 2015.

U.S. Appl. No. 14/885,202, filed Oct. 16, 2015.

U.S. Appl. No. 14/885,243, filed Oct. 16, 2015; now U.S. Pat. No. 9,530,709.

U.S. Appl. No. 15/387,855, filed Dec. 22, 2016.

(56) References Cited

OTHER PUBLICATIONS

U.S. Appl. No. 14/959,129, filed Dec. 4, 2015.
U.S. Appl. No. 15/173,037, filed Jun. 3, 2016.
U.S. Appl. No. 15/085,185, filed Mar. 30, 2016.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/287,273, filed Oct. 6, 2016.
Notice of Allowance for U.S. Appl. No. 15/293,947, dated Aug. 14, 2017, 7 pages.
Corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Notice of Allowance for U.S. Appl. No. 14/885,202, dated Jul. 24, 2017, 8 pages.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Non-Final Office Action for U.S. Appl. No. 15/293,947, dated Apr. 7, 2017, 12 pages.
Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/085,185, dated Jun. 6, 2017, 5 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Non-Final Office Action for U.S. Appl. No. 15/652,826, dated Nov. 3, 2017, 5 pages.
Notice of Allowance for U.S. Appl. No. 15/648,082, dated Nov. 29, 2017, 8 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.

* cited by examiner

THERMALLY ENHANCED SEMICONDUCTOR PACKAGE WITH THERMAL ADDITIVE AND PROCESS FOR MAKING THE SAME

RELATED APPLICATIONS

This application claims the benefit of provisional patent application Ser. No. 62/348,210, filed Jun. 10, 2016, the disclosure of which is hereby incorporated herein by reference in its entirety.

FIELD OF THE DISCLOSURE

The present disclosure relates to a semiconductor package and a process for making the same, and more particularly to a thermally enhanced semiconductor package, and a process to apply at least one thermal additive into the semiconductor package for enhanced thermal performance.

BACKGROUND

With the current popularity of portable communication devices and developed semiconductor fabrication technology, high speed and high performance transistors are more densely integrated on semiconductor dies. Consequently, the amount of heat generated by the semiconductor dies increases significantly due to the large number of transistors integrated on the semiconductor dies, the large amount of power passing through the transistors, and the high operation speed of the transistors. Accordingly, it is desirable to package the semiconductor dies in a configuration for better heat dissipation.

Flip chip assembly technology is widely utilized in semiconductor packaging due to its preferable solder interconnection between flip chip dies and the laminate, on which the flip chip dies are mounted. The flip chip assembly technology eliminates the space needed for wire bonding and the die surface areas of a package, and essentially reduces the overall size of the package. In addition, the elimination of the wire bonding and implementation of a shorter electrical path from the flip chip dies to the laminate reduces undesired inductance and capacitance.

Further, semiconductor dies with silicon on insulator (SOI) structures are trending due to the low cost of silicon materials, a large scale capacity of wafer production, well-established semiconductor design tools, and well-established semiconductor manufacturing techniques. However, harmonic generations and low resistivity values of the SOI structures severely limit the SOI's usage in radio-frequency (RF) applications. By using SOI structures in RF fabrications, an interface between the silicon handle layer and an adjacent dielectric layer will generate unwanted harmonic and intermodulation products. Such spectrum degradation causes a number of significant system issues, such as unwanted generation of signals in other RF bands, which the system is attempting to avoid.

To accommodate the increased heat generation of high performance dies and to utilize the advantages of flip chip assembly, it is therefore an object of the present disclosure to provide an improved semiconductor package design with flip chip dies in a configuration for better heat dissipation. In addition, there is also a need to eliminate the deleterious effects of harmonic generations and intermodulation distortions.

SUMMARY

The present disclosure relates to a thermally enhanced semiconductor package, and a process for making the same. The disclosed thermally enhanced semiconductor package includes a module substrate, a thinned flip chip die, a first mold compound component, and a thermally enhanced mold compound component. The thinned flip chip die includes a device layer, a number of interconnects extending from a lower surface of the device layer and coupled to an upper surface of the module substrate, and a dielectric layer over an upper surface of the device layer. The first mold compound component resides over the upper surface of the module substrate, surrounds the thinned flip chip die and extends above an upper surface of the thinned flip chip die to form a cavity over the upper surface of the thinned flip chip die. Herein, the cavity includes a lower region and an upper region that resides over the lower region. The thermally enhanced mold compound component includes a lower portion filling the lower region of the cavity and residing over the upper surface of the thinned flip chip die, and an upper portion filling the upper region of the cavity and residing over the lower portion. A first average thermal conductivity of the lower portion is at least 1.2 times greater than a second average thermal conductivity of the upper portion.

According to an exemplary process, a precursor package including a module substrate, a thinned flip chip die attached to an upper surface of the module substrate, a cavity over an upper surface of the thinned flip chip die, and a first mold compound component is provided. Herein, the first mold compound component resides over the upper surface of the module substrate, surrounds the thinned flip chip die, extends above the upper surface of the thinned flip chip die and surrounds the cavity. The cavity includes a lower region and an upper region that resides over the lower region. Next, at least one thermal additive is dispersed throughout the lower region of the cavity and immediately adjacent to the upper surface of the thinned flip chip die, where the at least one thermal additive includes a number of particulates. A second mold compound is then applied in the cavity to fill the lower region and the upper region of the cavity such that the second mold compound is dispersed throughout the number of particulates of the at least one thermal additive in the lower region without any air pockets or voids. Finally, the second mold compound is cured to harden the second mold compound in order to form a thermally enhanced mold compound component, which includes a lower portion with at least one thermal additive filling the lower region of the cavity, and an upper portion filling the upper region of the cavity and residing over the lower portion. A first average thermal conductivity of the lower portion is at least 1.2 times greater than a second average thermal conductivity of the upper portion.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
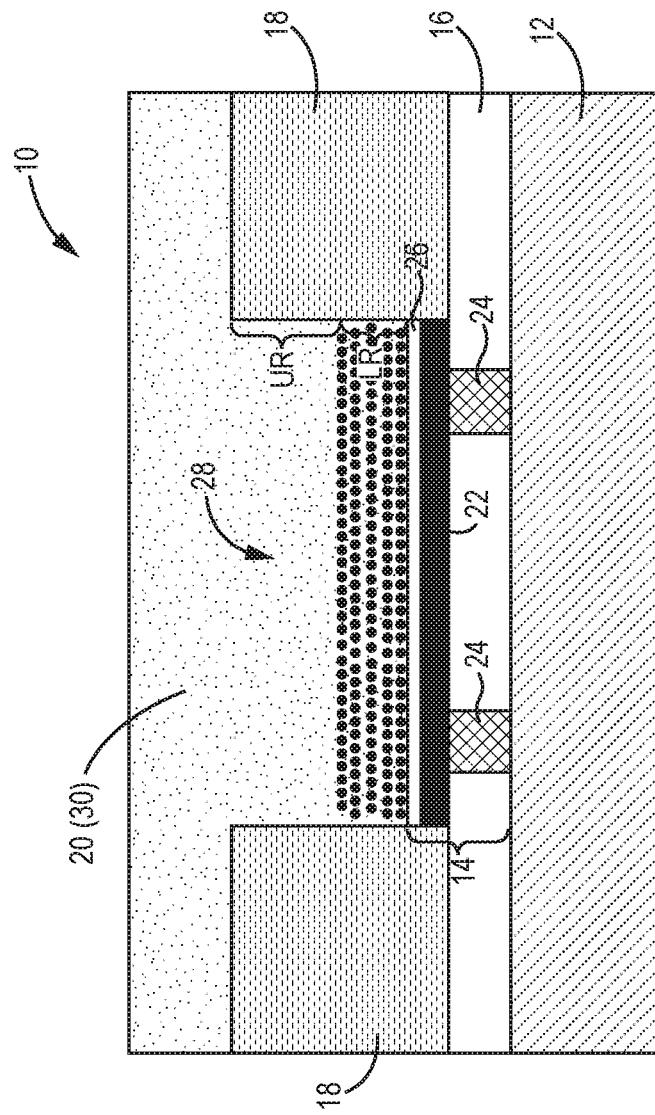
FIG. 1 shows an exemplary thermally enhanced semiconductor package according to one embodiment of the present disclosure.

FIGS. 3-8 provide exemplary steps that illustrate a process to fabricate the exemplary thermally enhanced semiconductor package shown in FIG. 1.

It will be understood that for clear illustrations, FIGS. 1-8 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a thermally enhanced semiconductor package, and a process for making the same. FIG. 1 shows an exemplary thermally enhanced semiconductor package 10 according to one embodiment of the present disclosure. For the purpose of this illustration, the exemplary thermally enhanced semiconductor package 10 includes a module substrate 12, a thinned flip chip die 14, an underfilling layer 16, a first mold compound component 18, and a thermally enhanced mold compound component 20. In different applications, the thermally enhanced semiconductor package 10 may include multiple thinned flip-chip dies.

In detail, the module substrate 12 may be formed from a laminate, a wafer level fan out (WLFO) carrier, a lead frame, a ceramic carrier, or the like. The thinned flip chip die 14 includes a device layer 22, a number of interconnects 24 extending from a lower surface of the device layer 22 and coupled to an upper surface of the module substrate 12, a dielectric layer 26 over an upper surface of the device layer 22, and essentially no silicon handle layer (not shown) over the dielectric layer 26. Herein, essentially no silicon handle layer over the dielectric layer 26 refers to at most 2 μm silicon handle layer over the dielectric layer 26. In some applications, an upper surface of the thinned flip chip die 14 is an upper surface of the dielectric layer 26. For other cases, the upper surface of the thinned flip chip die 14 is an upper surface of the thin silicon handle layer (not shown). The device layer 22 with a thickness between 10 nm and 20000 nm may be formed of silicon oxide, gallium arsenide, gallium nitride, silicon germanium, or the like, and the dielectric layer 26 with a thickness between 10 nm and 20000 nm may be formed of silicon oxide, silicon nitride, or aluminum nitride. The interconnects 24 with a height between 5 μm and 200 μm may be copper pillar bumps, solder ball bumps, or the like.

The underfilling layer 16 resides over the upper surface of the module substrate 12, such that the underfilling layer 16 encapsulates the interconnects 24 and underfills the thinned flip chip die 14 between the lower surface of the device layer 22 and the upper surface of the module substrate 12. The underfilling layer 16 may be formed from conventional polymeric compounds, which serve to mitigate the stress effects caused by Coefficient of Thermal Expansion (CTE) mismatch between the thinned flip chip die 14 and the module substrate 12.

The first mold compound component 18 resides over the underfilling layer 16, surrounds the thinned flip chip die 14, and extends above the upper surface of the thinned flip chip die 14 to form a cavity 28 over the upper surface of the thinned flip chip die 14. Herein, the cavity 28 includes a lower region LR and an upper region UR that resides over the lower region LR, and the upper surface of the thinned flip chip die 14 is exposed to the lower region LR of the cavity 28. In this embodiment, the lower region LR is at least 1% of the entire cavity 28. The first mold compound component 18 may be formed from a same or different material as the underfilling layer 16. When the first mold compound 18 and the underfilling layer 16 are formed from a same material, the first mold compound 18 and the underfilling layer 16 may be formed simultaneously. One exemplary material used to form the first mold compound component 18 is an organic epoxy resin system.

The thermally enhanced mold compound component 20 includes a lower portion with a first average thermal conductivity and an upper portion with a second average thermal conductivity. The lower portion of the thermally enhanced mold compound component 20 fills the lower region LR of the cavity 28 and resides over the upper surface of the thinned flip chip die 14. The upper portion of the thermally enhanced mold compound component 20 fills the upper region UR of the cavity 28 and resides over the lower portion of the thermally enhanced mold compound component 20. In some applications, the upper portion of the thermally enhanced mold compound component 20 may further reside over the first mold compound component 18.

The thermally enhanced mold compound component 20 is formed from a second mold compound component 30 mixed with a thermal additive 32, and has no air pockets or voids. The second mold compound component 30 may be formed from a same or different material as the first mold compound component 18. By definition, materials are different if they include different elements or have a different element composition. In higher performing embodiments, the second mold compound component 30 may be a high thermal conductivity mold compound component.

Compared to the normal mold compound component having a thermal conductivity about 0.8 w/m·k, the high thermal conductivity mold compound component has a thermal conductivity greater than 2.5 w/m·k, such as Hitachi Chemical Electronic Materials GE-506HT.

In addition, the thermal additive 32 is dispersed throughout the lower portion of the thermally enhanced mold compound component 20 at a first average density. The thermal additive 32 may have a varied density, which decreases gradually from a bottom to a top of the lower portion of the thermally enhanced mold compound component 20. The thermal additive 32 may be also dispersed in the upper portion of the thermally enhanced mold compound component 20 at a second average density, which is less than the first average density. In some applications, the upper portion of the thermally enhanced mold compound component 20 is void of the thermal additive 32. The thermal additive 32 has a thermal conductivity between 10 w/m·k and 5000 w/m·k, which is higher than the second mold compound component 30. Consequently, the thermally enhanced mold compound component 20 has greater thermal conductivity than the second mold compound component 30 alone. Depending on the different densities of the thermal additive 32 dispersed in the lower portion and upper portion of the thermal conductivity mold compound component 20, the first average thermal conductivity of the lower portion of the thermally enhanced mold compound component 20 is different from the second average thermal conductivity of the upper portion of the thermally enhanced mold compound component 20. In this embodiment, the first average thermal conductivity is at least 1.2 times greater than the second average thermal conductivity.

Notice that, besides the high thermal conductivity, the thermal additive 32 also has high electrical resistivity to accommodate radio-frequency (RF) properties of the thinned flip chip die 14. The thermal additive 32 may be formed from a number of micro-level particulates utilizing materials such as boron nitride, aluminum nitride, silicon nitride, alumina, beryllium oxide, carbon nanotube, and metamaterials. Boron nitride, due to its extremely high thermal conductivity (between 50 W/mK and 150 W/mK), extremely high electrical resistivity (greater than 1E12 Ohm-cm), and low cost, is a desired material for the thermal additive 32.

Heat generated by devices in the device layer 22 will travel upward to an area above the dielectric layer 26 and into the lower region LR of the cavity 28. The heat then passes downward through the dielectric layer 26, the device layer 22, and the interconnects 24 to the module substrate 12, which will dissipate the heat. It is therefore highly desirable to have a high thermal conductivity region immediately adjacent to the upper surface of the thinned flip chip die 14 to conduct most of the heat generated by the thinned flip chip die 14. Consequently, the higher the thermal conductivity in the lower region LR of the cavity 28, the better the heat dissipation performance of the thinned flip chip die 14. In this embodiment, the thermal additive 32 may directly contact the upper surface of the thinned flip chip die 14 in the lower region LR of the cavity 28. If the thinned flip chip die 14 does not have the silicon handle layer (not shown), the thermal additive 32 directly contacts the dielectric layer 26.

Figure 2A:
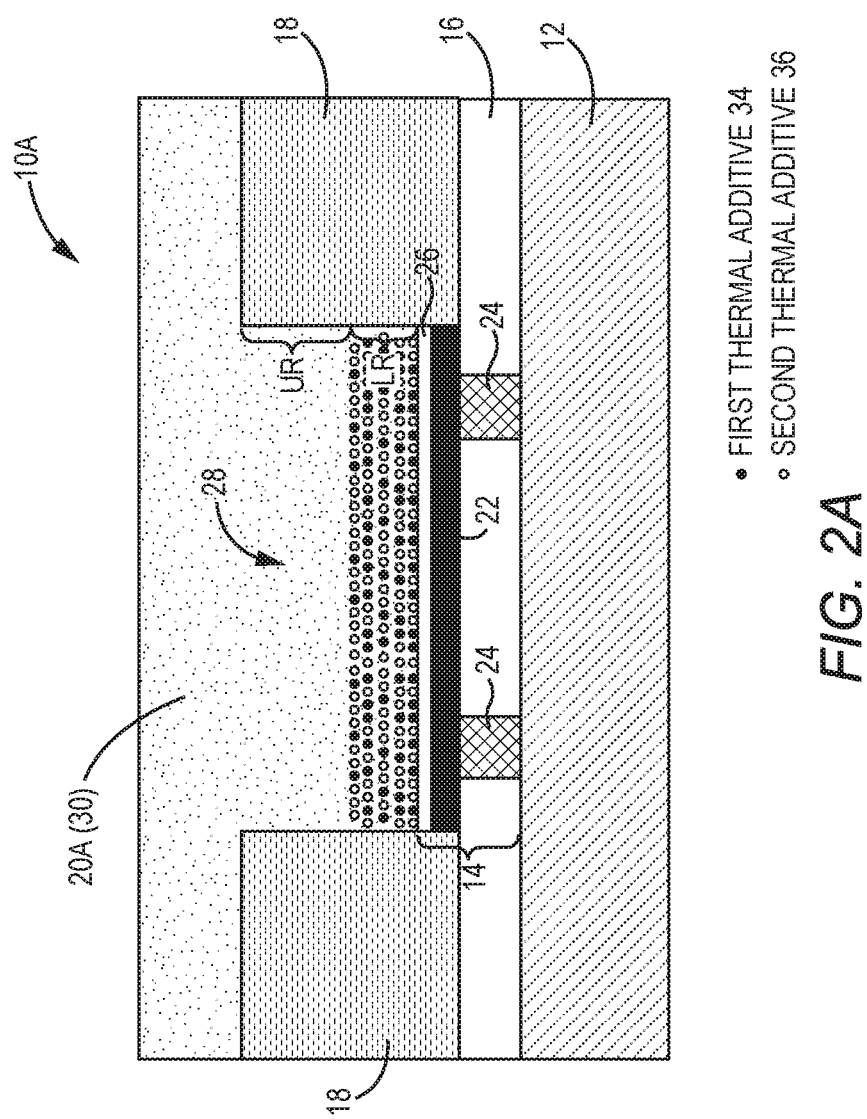
FIGS. 2A-2B show an alternative thermally enhanced semiconductor package according to one embodiment of the present disclosure.

It will be clear to those skilled in the art that more than one thermal additive may be used to enhance the heat dissipation performance of the thinned flip chip die 14. A thermally enhanced semiconductor package 10A with a thermally enhanced mold compound component 20A that includes a first thermal additive 34 and a second thermal additive 36 is illustrated in FIG. 2A. The first thermal additive 34 and the second thermal additive 36 are each dispersed throughout a lower portion of the thermally enhanced mold compound component 20A. The first thermal additive 34 and the second thermal additive 36 may be formed from different materials having different thermal conductivities. By definition, materials are different if they include different elements or have a different element composition.

Figure 2B:
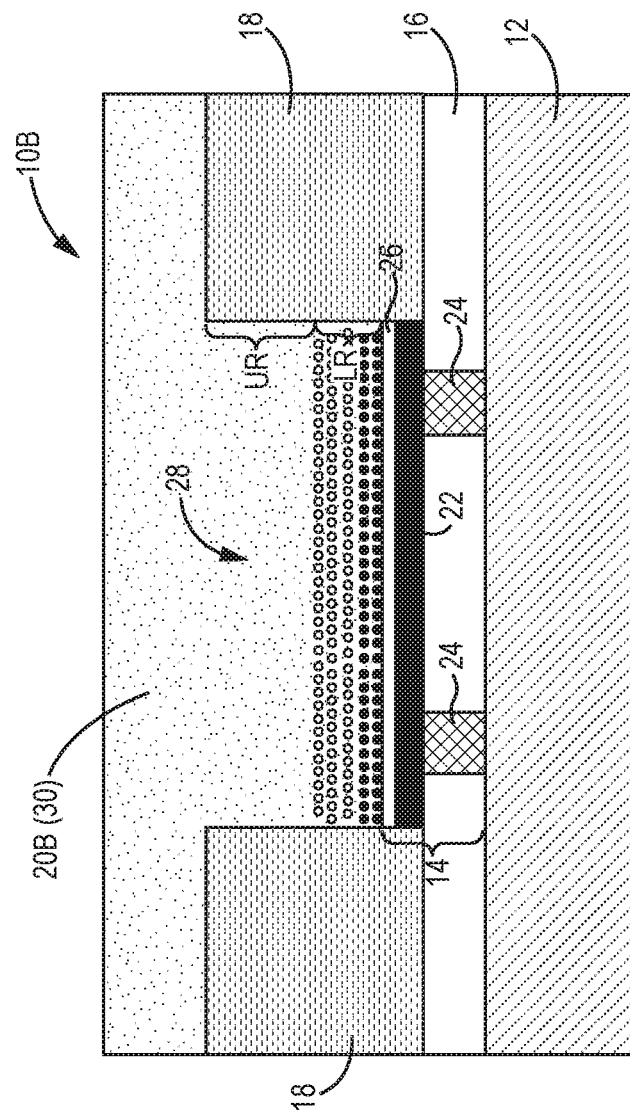

Alternatively, the first thermal additive 34 and the second thermal additive 36 may be dispersed in different portions of a thermally enhanced mold compound component 20B within a thermally enhanced semiconductor package 10B as depicted in FIG. 2B. The lower portion of the thermally enhanced mold compound 20B includes a first lower portion, which resides over the upper surface of the thinned flip chip die 14, and a second lower portion, which resides over the first lower portion. The first thermal additive 34 is dispersed throughout the first lower portion, and the second thermal additive 36 is dispersed throughout the second lower portion. The first thermal additive 34 and the second thermal additive 36 may be formed from different materials, and the first thermal additive 34 may have higher thermal conductivity than the second thermal additive 36.

FIGS. 3-8 provide exemplary steps that illustrate a process to fabricate the exemplary thermally enhanced semiconductor package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-8.

Figure 3:
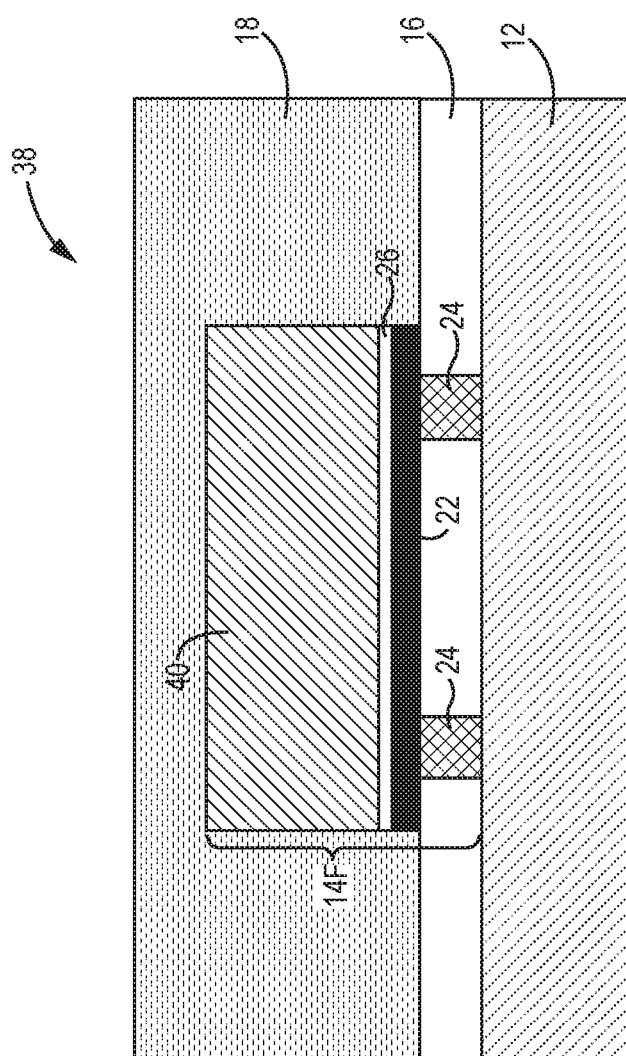

Initially, a semiconductor package 38 is provided as depicted in FIG. 3. For the purpose of this illustration, the semiconductor package 38 includes the module substrate 12, a flip chip die 14F, the underfilling layer 16, and the first mold compound component 18. In different applications, the semiconductor package 38 may include multiple flip chip dies. In detail, the flip chip die 14F includes the device layer 22, the interconnects 24 extending from a lower surface of the device layer 22 and coupled to the upper surface of the module substrate 12, the dielectric layer 26 over the upper surface of the device layer 22, and a silicon handle layer 40 over the dielectric layer 26. As such, the backside of the silicon handle layer 40 is a top surface of the flip chip die 14F. In addition, the underfilling layer 16 resides over the upper surface of the module substrate 12, such that the underfilling layer 16 encapsulates the interconnects 24 and underfills the flip chip die 14F between the lower surface of the device layer 22 and the upper surface of the module substrate 12. The first mold compound component 18 resides over the underfilling layer 16 and encapsulates the flip chip die 14F. The first mold compound component 18 may be used as an etchant barrier to protect the flip chip die 14F against etching chemistries such as Tetramethylammonium hydroxide (TMAH), potassium hydroxide (KOH), sodium hydroxide (NaOH), and acetylcholine (ACH) in the following steps.

Figure 4:
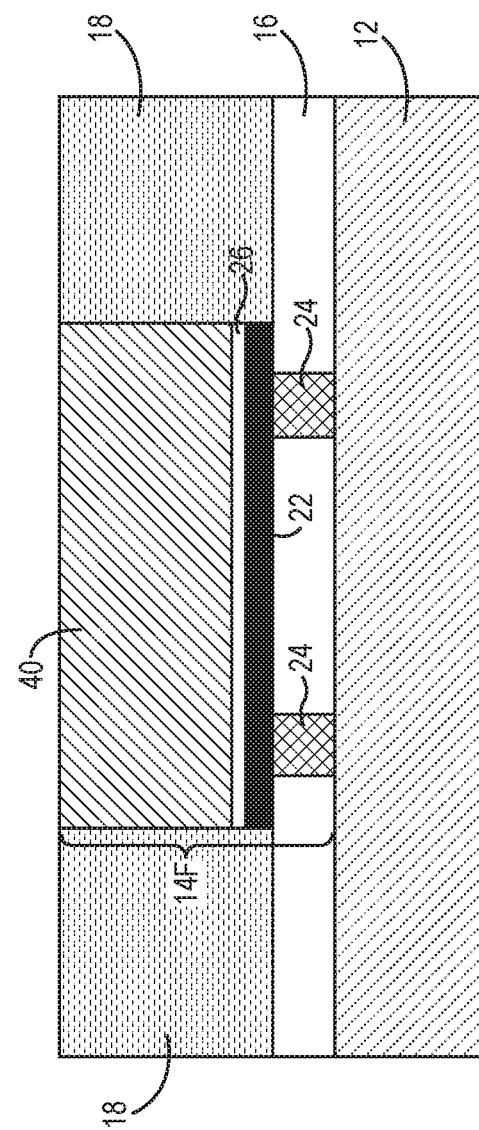
Figure 5:
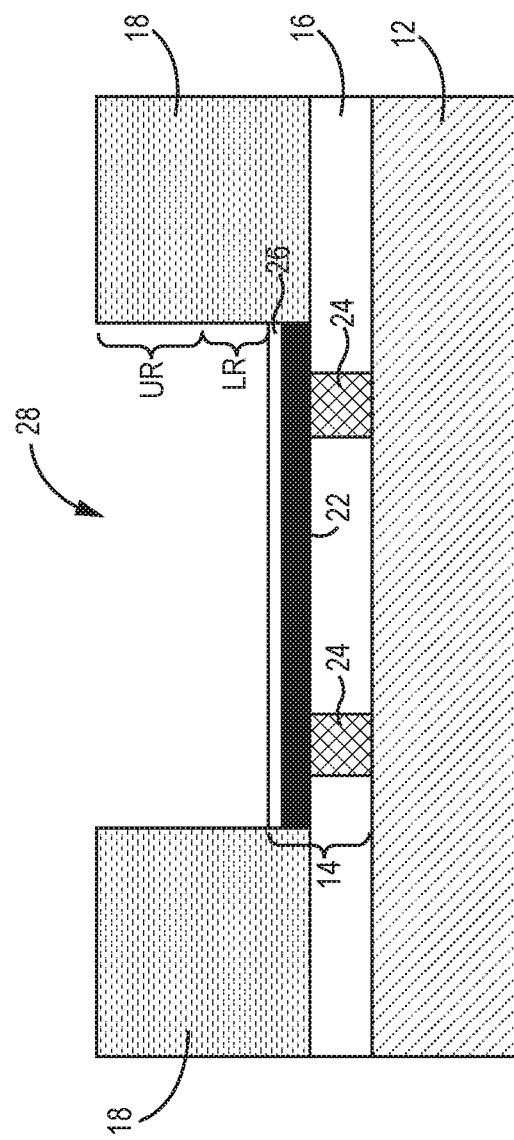

Next, the first mold compound component 18 is thinned down to expose the backside of the silicon handle layer 40 of the flip chip die 14F, as shown in FIG. 4. The thinning procedure may be done with a mechanical grinding process. The following step is to remove substantially the entire silicon handle layer 40 of the flip chip die 14F to create the cavity 28 and provide the thinned flip chip die 14 with the upper surface exposed to the cavity 28, as shown in FIG. 5. Herein, removing substantially the entire silicon handle layer 40 refers to removing at least 95% of the entire silicon handle layer 40, and perhaps a portion of the dielectric layer 26. As such, in some applications, the thinned flip chip die 14 may refer to a device including the device layer 22, the interconnects 24 extending from the lower surface of the device layer 22 and coupled to the module substrate 12, and the dielectric layer 26 over the upper surface of the device layer 22, where the upper surface of the dielectric layer 26 is the upper surface of the thinned flip chip die 14. For other cases, the thinned flip chip die 14 may refer to a device including the device layer 22, the interconnects 24 extending from the lower surface of the device layer 22 and coupled to the module substrate 12, the dielectric layer 26 over the upper surface of the device layer 22, and a thin (less than 2 μm) silicon handle layer 40 left over the dielectric layer 26, where the upper surface of the thin silicon handle layer 40 is the upper surface of the thinned flip chip die 14. Because the silicon handle layer 40 is removed substantially, deleterious harmonic generations and intermodulation distortions at an interface between the silicon handle layer 40 and the dielectric layer 26 may be eliminated. Removing substantially the entire silicon handle layer 40 may be provided by an etching process with a wet/dry etchant chemistry, which may be TMAH, KOH, ACH, NaOH, or the like.

Figure 6:
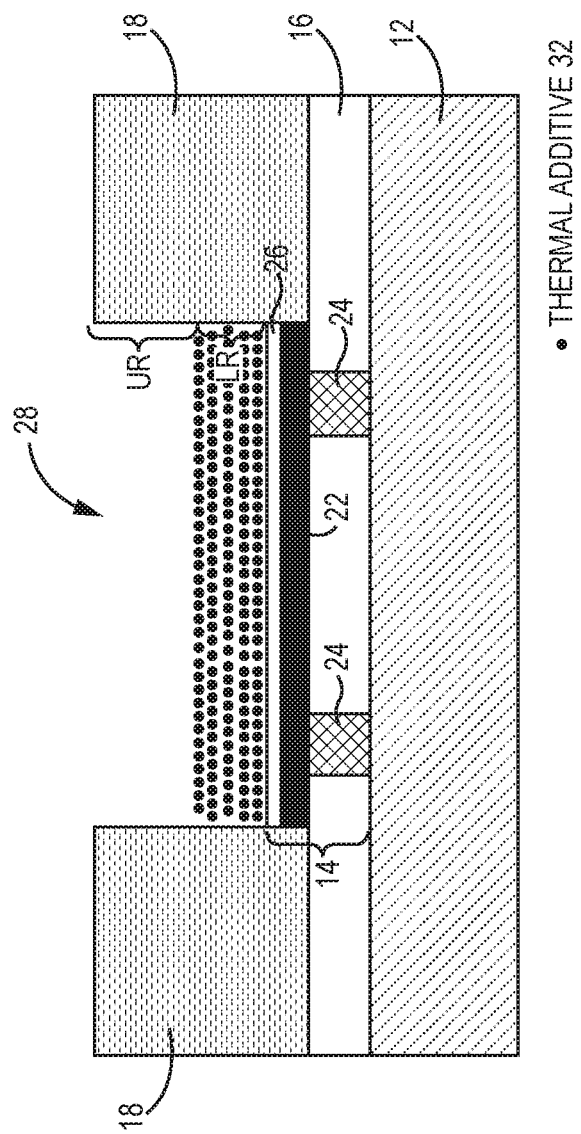

Herein, the cavity 28 includes the lower region LR and the upper region UR that resides over the lower region LR, and the upper surface of the thinned flip chip die 14 is exposed to the lower region LR of the cavity 28. The thermal additive 32 is then applied throughout the lower region LR of the cavity 28 at the first average density as depicted in FIG. 6. The thermal additive 32 may be formed from a number of micro-level particulates and may have a varied density through the lower region LR of the cavity 28. In this embodiment, the density of the thermal additive 32 may decrease gradually from the bottom to the top of the lower region LR of the cavity 28. Applying the thermal additive 32 throughout the lower region LR of the cavity 28 may be provided by dispensing the thermal additive 32 immediately over the upper surface of the thinned flip chip die 14F and squeegeeing the thermal additive 32 into the lower region LR of the cavity 28. Other techniques, such as a direct local dispensing process using an electrostatic header or a local placement process using Pick-and-Place tools, may also be utilized to apply the thermal additive 32 throughout the lower region LR of the cavity 28. It will be clear to those skilled in the art that more than one thermal additive may be applied throughout the lower region LR of the cavity 28 (not shown).

Figure 7:
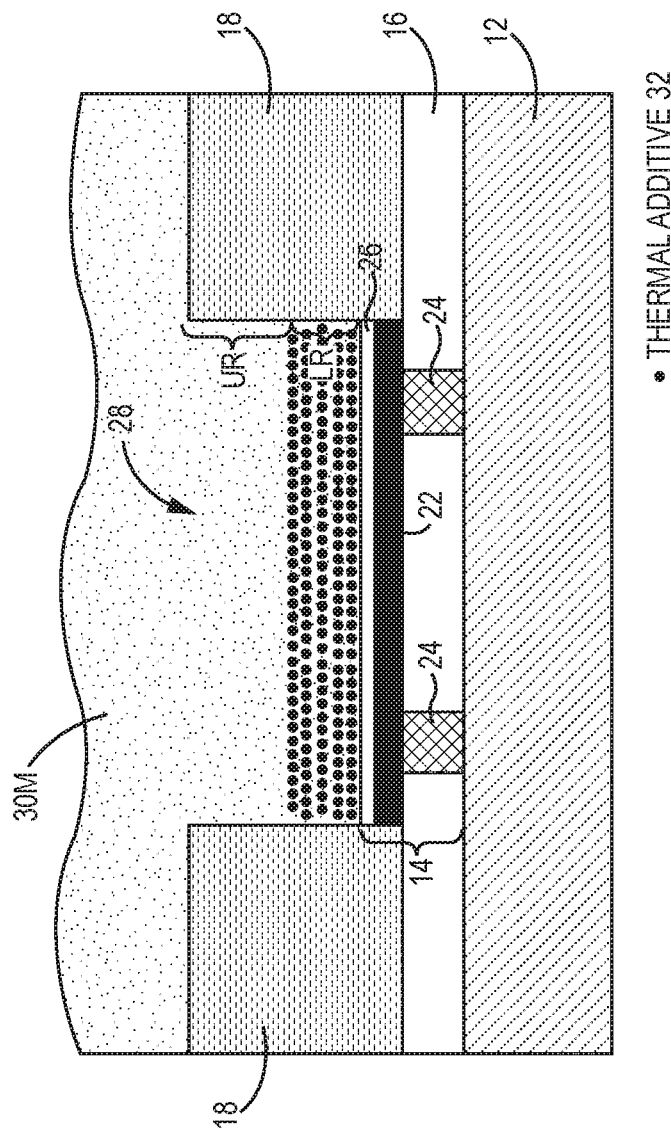

After the thermal additive 32 is dispersed throughout the lower region LR of the cavity 28, the second mold compound 30M is applied in the cavity 28 to fill the lower region LR and the upper region UR of the cavity 28 as depicted in FIG. 7. As such, the second mold compound 30M is dispersed throughout the number of particulates of the thermal additive 32 in the lower region LR of the cavity 28. Because air pockets or voids have poor thermal conductivity, formation of any air pockets or voids will be avoided during filling of the lower region LR and the upper region UR of the cavity 28 by the second mold compound 30M. The second mold compound 30M may further reside over the first mold compound component 18. A curing process (not shown) is followed to harden the second mold compound 30M in order to form the second mold compound component 30 and complete the thermally enhanced mold compound component 20. The curing temperature is between 100° C. and 320° C. depending on which material is used as the second mold compound 30M.

The thermally enhanced mold compound component 20 includes the lower portion filling the lower region LR of the cavity 28 and the upper portion filling the upper region UR of the cavity 28. Herein, the thermal additive 32 is dispersed throughout the lower portion of the thermally enhanced mold compound component 20 without any air pockets or voids. Since the thermal additive 32 has a higher thermal conductivity than the second mold compound component 30, the thermally enhanced mold compound component 20 has greater thermal conductivity than the second mold compound component 30 alone. Further, if the upper portion of the thermally enhanced mold compound component 20 includes the thermal additive 32 at a second average density, which is less than the first average density, the first average thermal conductivity of the lower portion of the thermally enhanced mold compound component 20 is greater than the second average thermal conductivity of the upper portion of the thermally enhanced mold compound component 20. In this embodiment, the first average thermal conductivity is at least 1.2 w/m·k and the second average thermal conductivity is at least 0.8 w/m·k. The first average thermal conductivity is at least 1.2 times greater than the second average thermal conductivity.

Figure 8:
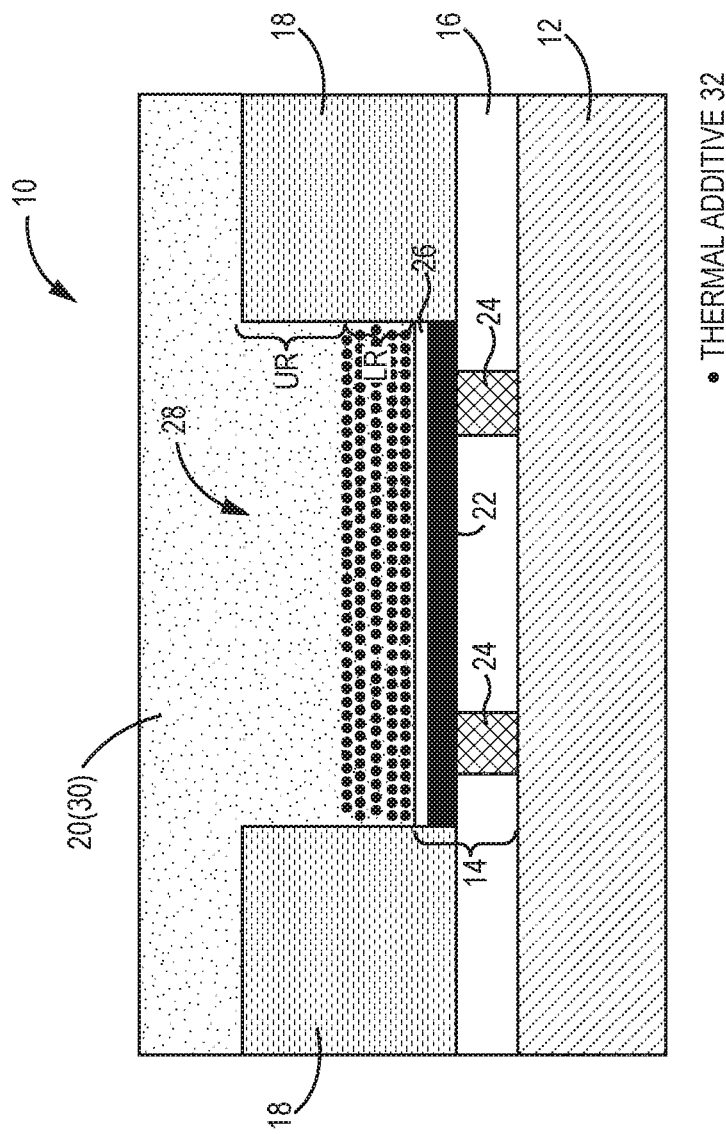

Finally, an upper surface of the thermally enhanced mold compound component 20 is planarized to form the thermally enhanced semiconductor package 10 as depicted in FIG. 8. A mechanical grinding process may be used for planarization. The upper portion of the thermally enhanced mold compound component 20 may reside over the first mold compound component 18.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a module substrate having an upper surface;
   a thinned flip chip die comprising:
      a device layer;
      a dielectric layer over an upper surface of the device layer; and
      a plurality of interconnects extending from a lower surface of the device layer and coupled to the upper surface of the module substrate;
   a first mold compound component residing over the upper surface of the module substrate, surrounding the thinned flip chip die, and extending above an upper surface of the thinned flip chip die to form a cavity over the upper surface of the thinned flip chip die, wherein the cavity includes a lower region and an upper region that resides over the lower region; and
   a thermally enhanced mold compound component comprising:
      a lower portion with a first average thermal conductivity, wherein the lower portion fills the lower region of the cavity and resides over the upper surface of the thinned flip chip die; and
      an upper portion with a second average thermal conductivity, wherein the upper portion fills the upper region of the cavity and resides over the lower portion, and the first average thermal conductivity of the lower portion is at least 1.2 times greater than the second average thermal conductivity of the upper portion.

2. The apparatus of claim 1 wherein the thermally enhanced mold compound component is formed from a second mold compound component mixed with at least one thermal additive, and has no air pockets or voids, wherein the at least one thermal additive has a higher thermal conductivity than the second mold compound component and is dispersed throughout the lower portion at a first average density.

3. The apparatus of claim 2 wherein the at least one thermal additive is further dispersed in the upper portion at a second average density, which is less than the first average density.

4. The apparatus of claim 2 wherein the upper portion is void of the at least one thermal additive.

5. The apparatus of claim 2 wherein the at least one thermal additive is formed from boron nitride particulates.

6. The apparatus of claim 2 wherein the at least one thermal additive is formed from one of a group consisting of aluminum nitride, silicon nitride, alumina, beryllium oxide, carbon nanotube, and metamaterials.

7. The apparatus of claim 2 wherein the at least one thermal additive comprises a first thermal additive and a second thermal additive, which are each dispersed throughout the lower portion.

8. The apparatus of claim 2 wherein the at least one thermal additive comprises a first thermal additive and a second thermal additive, and the lower portion comprises a first lower portion and a second lower portion, wherein:
   the first lower portion resides over the upper surface of the thinned flip chip die and the first thermal additive is dispersed throughout the first lower portion; and
   the second lower portion resides over the first lower portion, and the second thermal additive is dispersed throughout the second lower portion.

9. The apparatus of claim 2 wherein the first mold compound component and the second mold compound component are formed from different materials.

10. The apparatus of claim 1 wherein the first average thermal conductivity is at least 1.2 w/m·k.

11. The apparatus of claim 10 wherein the second average thermal conductivity is at least 0.8 w/m·k.

12. The apparatus of claim 1 wherein the first average thermal conductivity is at least 3 w/m·k.

13. The apparatus of claim 12 wherein the second average thermal conductivity is at least 2.5 w/m·k.

14. The apparatus of claim 1 wherein the lower region is at least 1% of the entire cavity.

15. The apparatus of claim 1 further comprising an underfilling layer residing between the first mold compound component and the upper surface of the module substrate, and underfilling the thinned flip chip die between the lower surface of the device layer and the upper surface of the module substrate.

16. The apparatus of claim 15 wherein the underfilling layer is formed from a same material as the first mold compound component.

17. The apparatus of claim 1 wherein the upper portion of the thermally enhanced mold compound component further resides over the first mold compound component.

18. The apparatus of claim 1 wherein the upper surface of the thinned flip chip die is an upper surface of the dielectric layer.

* * * * *